United States Patent
Lee et al.

(10) Patent No.: US 8,174,278 B2
(45) Date of Patent: May 8, 2012

(54) TEST BOARD AND TEST SYSTEM

(75) Inventors: Nam-Joong Lee, Suwon-si (KR);
Weon-Tark Kang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 904 days.

(21) Appl. No.: 12/283,872

(22) Filed: Sep. 16, 2008

(65) Prior Publication Data

US 2009/0076747 A1    Mar. 19, 2009

(30) Foreign Application Priority Data

Sep. 17, 2007  (KR) .................. 10-2007-0094008

(51) Int. Cl.
*G01R 31/00*    (2006.01)

(52) U.S. Cl. ................................ 324/756.02

(58) Field of Classification Search .......... None
See application file for complete search history.

(56) References Cited

U.S. PATENT DOCUMENTS

| | | | |
|---|---|---|---|
| 6,408,412 B1* | 6/2002 | Rajsuman | 714/724 |
| 6,617,868 B1* | 9/2003 | Needham | 324/750.09 |
| 7,292,046 B2* | 11/2007 | Buheis et al. | 324/537 |
| 2008/0174331 A1* | 7/2008 | Yuan-Chi et al. | 324/765 |

FOREIGN PATENT DOCUMENTS

| | | |
|---|---|---|
| JP | 2004-53352 | 2/2004 |
| JP | 2006-162285 | 6/2006 |
| KR | 2002-0005820 | 1/2002 |
| KR | 10-2005-0047928 | 5/2005 |

* cited by examiner

*Primary Examiner* — Roberto Velez
(74) *Attorney, Agent, or Firm* — Onello & Mello, LLP

(57) ABSTRACT

A test board includes a socket, a mounting test circuit, and a relay. An analog core embedded application processor is installed into the socket. The mounting test circuit has a same configuration as an environment where the analog core embedded application processor is actually used. The relay disconnects the mounting test circuit from the socket in response to a first control signal when a vector test is performed on the analog core embedded application processor, and that connects the mounting test circuit to the socket in response to a second control signal when a mounting set test is performed on the analog core embedded application processor.

12 Claims, 4 Drawing Sheets

TEST BOARD AND TEST SYSTEM

RELATED APPLICATION

This application claims priority under 35 U.S.C. Section 119 to Korean Patent Application No. 10-2007-094008, filed in the Korean Intellectual Property Office on Sep. 17, 2007, the entire contents of which are incorporated herein by reference.

BACKGROUND

1. Technical Field

Example embodiments relate to a semiconductor integrated circuit, and more particularly to a test board and a test system for a semiconductor integrated circuit.

2. Description of the Related Art

Presently, most semiconductor integrated circuits are tested by automatic test equipment (ATE) for increasing yield of the semiconductor integrated circuits. Electric characteristics of the semiconductor integrated circuits are tested by the ATE. Power supply voltages and input signals are applied to the semiconductor integrated circuits, and output signals are measured for testing the electric characteristics of the semiconductor integrated circuits.

However, the conventional ATE only can measure the electric characteristics of the semiconductor integrated circuits, and a mounting set test cannot be easily performed on a set application circuit that has the same configuration as an environment where the semiconductor integrated circuits are actually used. Therefore, when a user configures the semiconductor integrated circuits as a set application circuit and uses the set application circuit, problems in the set application circuit frequently occur and thus there is a need for additional testing of the set application circuit.

SUMMARY

Example embodiments provide a test board that performs a vector test and a mounting set test on an analog core embedded application processor.

Example embodiments provide a test system that performs a vector test and a mounting set test on an analog core embedded application processor.

Example embodiments provide a method of performing a vector test and a mounting set test on an analog core embedded application processor by using the test board.

According to a first aspect, the invention is directed to a test board which includes a socket, a mounting test circuit, and a relay. An analog core embedded application processor is installed into the socket. The mounting test circuit has a same configuration as an environment where the analog core embedded application processor is actually used. The relay disconnects the mounting test circuit from the socket in response to a first control signal when a vector test is performed on the analog core embedded application processor, and that connects the mounting test circuit to the socket in response to a second control signal when a mounting set test is performed on the analog core embedded application processor.

In some example embodiments, the vector test may be performed on the analog core embedded application processor, and a first test result is provided to an automatic test equipment (ATE), when the first signal is enabled. The first test result indicates a result of the vector test.

In some example embodiments, the mounting set test may be performed on the analog core embedded application processor according to the first test result.

In some example embodiments, when the first test result corresponds to "pass", the second control signal may be enabled, the mounting test circuit may be connected to the socket, the mounting set test may be performed on the analog core embedded application processor, and a second test result may be provided to the ATE. The second test result indicates a result of the mounting set test.

In some example embodiments, the mounting test circuit may include a first memory, a second memory and a buffer. The first memory may store a booting program for booting the analog core embedded application processor and a test program for the mounting set test on the analog core embedded application processor. The booting program and the test program may be loaded into the second memory. The buffer may be coupled to the first memory, the second memory and the relay.

In some example embodiments, the first memory may correspond to a non-volatile memory. The second memory may correspond to a volatile memory.

According to another aspect, the present invention is directed to a test system which includes a test board and an ATE. The test board includes socket, a mounting test circuit, and a relay. An analog core embedded application processor is installed into the socket. The mounting test circuit has a same configuration as an environment where the analog core embedded application processor is actually used. The relay disconnects the mounting test circuit from the socket in response to a first control signal when a vector test is performed on the analog core embedded application processor, and that connects the mounting test circuit to the socket in response to a second control signal when a mounting set test is performed on the analog core embedded application processor. The ATE stores a first program for the vector test, and provides the first control signal and the second control signal to the test board.

In some example embodiments, the vector test may be performed on the analog core embedded application processor, and a first test result is provided to an automatic test equipment (ATE), when the first signal is enabled. The first test result indicates a result of the vector test.

In some example embodiments, the mounting set test is performed on the analog core embedded application processor according to the first test result.

In some example embodiments, when the first test result corresponds to "pass", the second control signal may be enabled, the mounting test circuit may be connected to the socket, the mounting set test may be performed on the analog core embedded application processor, and a second test result may be provided to the ATE. The second test result indicates a result of the mounting set test.

In some example embodiments, the mounting test circuit may include a first memory, a second memory and a buffer. The first memory may store a booting program for booting the analog core embedded application processor and a test program for the mounting set test on the analog core embedded application processor. The booting program and the test program may be loaded into the second memory. The buffer may be coupled to the first memory, the second memory and the relay.

In some example embodiments, the first memory may correspond to a non-volatile memory. The second memory may correspond to a volatile memory.

According to another aspect, the present invention is directed to a test board comprising: a first socket into which an analog core embedded application processor is installed and a vector test is performed on the installed analog core embedded application processor in response to a first control signal; and a mounting test circuit including a second socket into which the analog core embedded application processor is installed in response to a second control signal, the mounting test circuit being physically disconnected form the first socket and having a same configuration as an environment where the analog core embedded application processor is actually used, a mounting set test being performed on the analog core embedded application processor in the second socket.

In some example embodiments, the mounting set test may be performed when the analog core embedded application processor passes the vector test.

In some example embodiments, the mounting test circuit may include a first memory, a second memory and a buffer. The first memory may store a booting program for booting the analog core embedded application processor and a test program for the mounting set test on the analog core embedded application processor. The booting program and the test program may be loaded into the second memory. The buffer is coupled to the first memory, the second memory and a relay.

In some example embodiments, the first memory may correspond to a non-volatile memory. The second memory may correspond to a volatile memory.

According to some example embodiments, in a method of testing an analog core embedded application processor by using a test board including a socket into which the analog core embedded application processor is installed, a mounting test circuit that has a same configuration as an environment where the analog core embedded application processor is actually used, and a relay that connects the mounting test circuit to the socket, a vector test is performed on the analog core embedded application processor in response to a first control signal. A mounting set test is selectively performed on the analog core embedded application processor in response to a second control signal that is enabled based on a result of the vector test.

Accordingly, test time and cost may be reduced by performing a vector test and a mounting set test an analog core embedded application processor by using one test board.

BRIEF DESCRIPTION OF THE DRAWINGS

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE EMBODIMENTS

Figure 1:
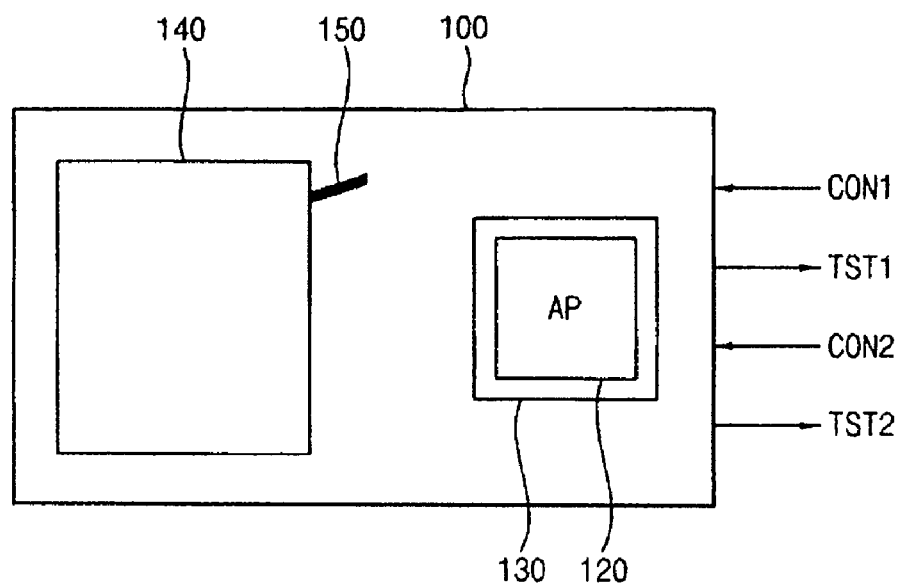
FIG. 1 is a block diagram illustrating a test board according to an example embodiment of the present invention.

This applications claims priority under 35 USC §119 to Korean Patent Application No. 2007-0094008, filed on Sep. 17, 2007 in the Korean Intellectual Property Office (KIPO), the contents of which are herein incorporated by reference in their entirety.

Various example embodiments will be described more fully with reference to the accompanying drawings, in which some example embodiments are shown. The present invention may, however, be embodied in many different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the present invention will be described in detail with reference to the accompanying drawings.

FIG. 1 is a block diagram illustrating a test board according to an example embodiment of the present invention.

Referring to FIG. 1, a test board 100 includes a socket 130 into which an analog core embedded application processor 120 is installed, a mounting test circuit 140 and a relay 150.

The mounting test circuit 140 has a same configuration as an environment where the analog core embedded application processor 120 is actually used.

Figure 2:
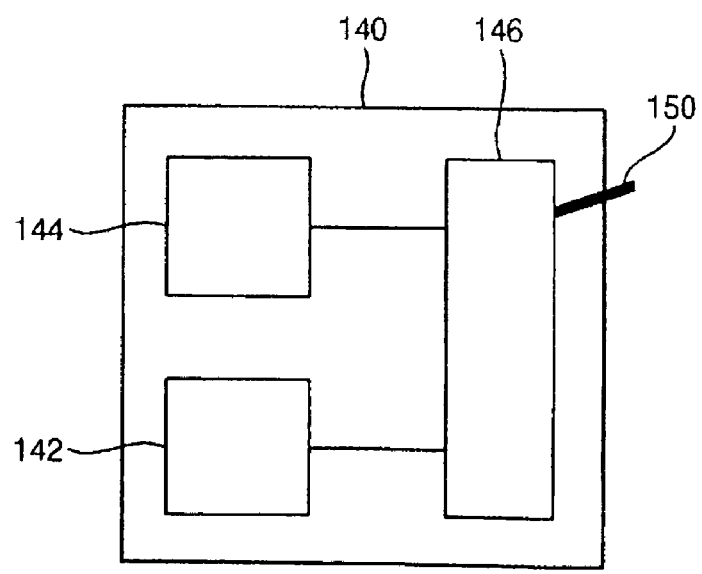
FIG. 2 is a block diagram illustrating the mounting test circuit of FIG. 1.

FIG. 2 is a block diagram illustrating the mounting test circuit 140 of FIG. 1.

Referring to FIG. 2, the mounting test circuit 140 includes a first memory 142, a second memory 144 and a buffer 146. The first memory 142 and the second memory 144 are electrically coupled to the buffer 146, and the buffer 146 is connected to the relay 150. The first memory 142 may include a booting program for booting the analog core embedded application processor 120 and a test program for a mounting set test on the analog core embedded application processor 120. The mounting set test is a test where the analog core embedded application processor 120 is tested in an environment where the analog core embedded application processor is actually used. The first memory 142 may be a non-volatile memory such as a flash memory. The second memory 144 may be a volatile memory such as a DRAM.

Referring again to FIG. 1, the test board receives a first control signal CON1 that is provided externally, for example from an automatic test equipment (ATE). The first control signal CON1 may be a start signal of a vector test on the analog core embedded application processor 120. The vector test is preformed for testing the electrical performance of the analog core embedded application processor 120, and a test program for the vector test may be stored in the ATE (not illustrated).

When the first control signal CON1 is enabled, the relay 150 disconnects physically the mounting test circuit 140 from the socket 130, and the vector test is performed on the analog core embedded application processor 120. That is, when the vector test is performed on the analog core embedded application processor 120, the mounting test circuit 140 does not influence the vector test.

A vector test result TST1 on the analog core embedded application processor 120 is provided to the external ATE. Whether a mounting set test on the analog core embedded application processor 120 is performed or not is determined based on the vector test result TST1.

When the vector test result TST1 indicates "fail", that is, when the analog core embedded application processor 120 does not pass the vector test, an external handler (not illustrated) uninstalls the analog core embedded application processor 120 from the socket 130, and a new analog core embedded application processor to be subsequently tested is installed into the socket 130. The mounting set test is not performed on the analog core embedded application processor that did not pass the vector test.

When the vector test result TST1 indicates "pass", that is, when the analog core embedded application processor 120 passes the vector test, a second control signal CON2 is enabled. The second control signal CON2 may be provided from the external ATE, and the second control signal CON2 may be a start signal of the mounting set test on the analog core embedded application processor 120.

When the second control signal CON2 is enabled, the relay 150 connects the mounting test circuit 140 to the socket 130, and the mounting set test is performed on the analog core embedded application processor 120 installed into the socket 130.

When the second control signal CON2 is enabled and the mounting test circuit 140 is connected to the socket 130, the booting program and the test program stored in the first memory 142 are loaded onto the second memory 144 through the buffer 146, the mounting set test is performed on the analog core embedded application processor 120 by using the test program. When the mounting set test on the analog core embedded application processor 120 is completed, a mounting set test result TST2 is provided to the external ATE. Therefore, the vector test result TST1 and the mounting set test result TST2 are identified by the external ATE.

Figure 3:
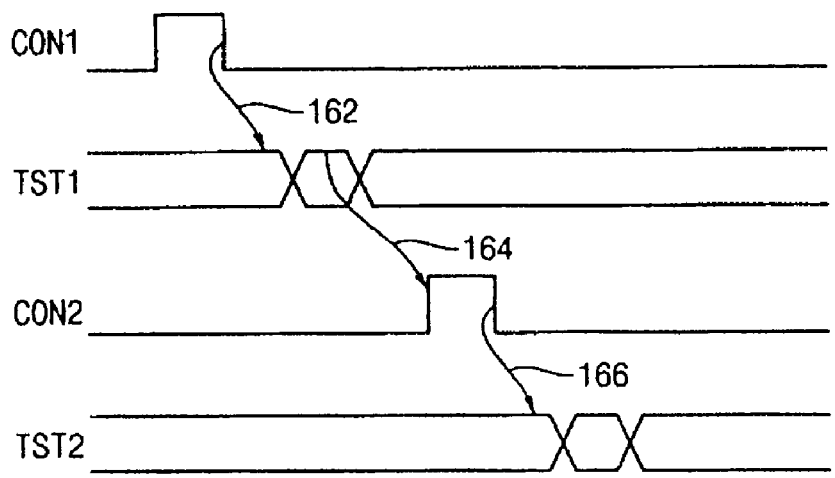
FIG. 3 is a timing diagram illustrating signals indicating operation of the test board of FIG. 1.

FIG. 3 is a timing diagram illustrating signals indicating operation of the test board of FIG. 1.

Referring to FIGS. 1 to 3, when the first control signal CON1 is enabled, the vector test is performed 162 on the analog core embedded application processor 120 and the vector test result TST1 is provided. When the vector test result TST1 corresponds to "pass" 164, the second control signal CON2 is enabled, the mounting set test is performed 166, and the mounting set test result TST2 is provided. In an example embodiment of FIG. 3, the first and second control signals CON1 and CON2, the vector test result TST1 and the mounting set test result TST2 are enabled at logic high levels. In another example embodiment, the first and second control signals CON1 and CON2, the vector test result TST1 and the mounting set test result TST2 may be enabled at logic low levels.

Figure 4:
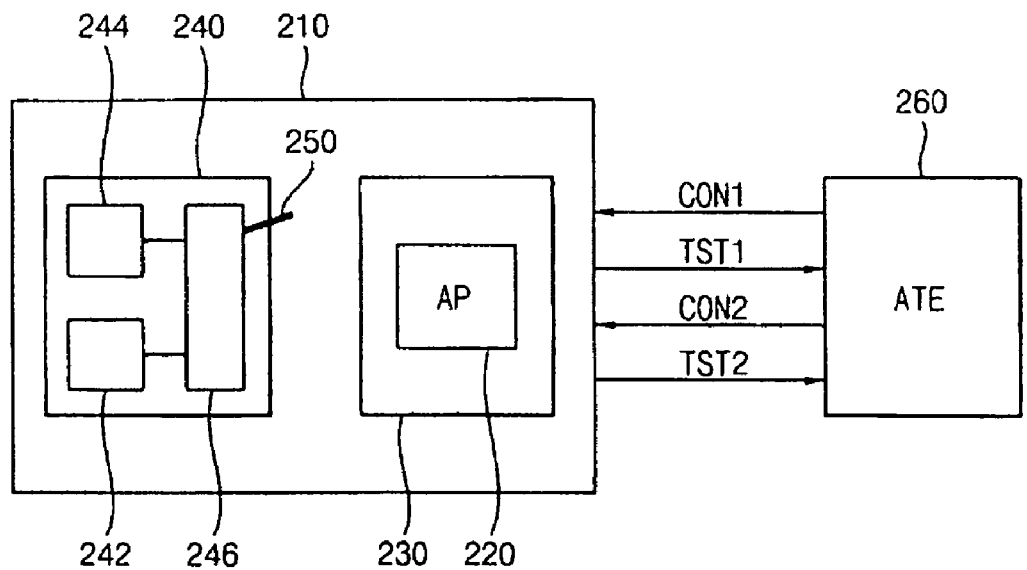
FIG. 4 is a block diagram illustrating a test system according to an example embodiment of the present invention.

FIG. 4 is a block diagram illustrating a test system according to an example embodiment.

Referring to FIG. 4, a test system 200 includes a test board 210 and an automatic test equipment (ATE) 260.

The ATE 260 stores a first test program for a vector test of an analog core embedded application processor 220, and provides a first control signal CON1 and a second control signal CON2 to the test board 210.

The test board 210 includes a socket 230 into which an analog core embedded application processor 220 is installed, a mounting test circuit 240 and a relay 250. The mounting test circuit 240 includes a first memory 242, a second memory 244 and a buffer 246. The first memory 242 may include a booting program for booting the analog core embedded application processor 220 and a second test program for a mounting set test on the analog core embedded application processor 220. The first memory 242 may be a non-volatile memory such as a flash memory. The second memory 244 may be a volatile memory such as a DRAM.

When the first control signal CON1 is enabled, the vector test is performed on the analog core embedded application processor 220 and a vector test result TST1 on the analog core embedded application processor 220 is provided to the ATE 260. When the vector test result TST1 indicates "pass", the second control signal CON2 is enabled. When the second control signal CON2 is enabled, the relay 250 connects the mounting test circuit 240 to the socket 230, the mounting set test is performed on the analog core embedded application processor 220 installed into the socket 230 and a mounting set test result TST2 is provided to the ATE 260. When the vector test result TST1 indicates "fail", an external handler (not illustrated) uninstalls the analog core embedded application processor 220 from the socket 230. The mounting set test is not performed on the analog core embedded application processor that did not pass the vector test, and a new analog core embedded application processor to be subsequently tested is installed into the socket 230. Operating of the test system 200 of FIG. 4 is similar to operation of the test board 100 of FIG. 1, and thus further description of the test system 200 will not be repeated.

The test board and the test system according to example embodiments may perform a vector test and a mounting set test on an analog core embedded application processor on one test board, perform the mounting set test on the analog core embedded application processor that passed the vector test, and thus test time may be reduced.

Figure 5:
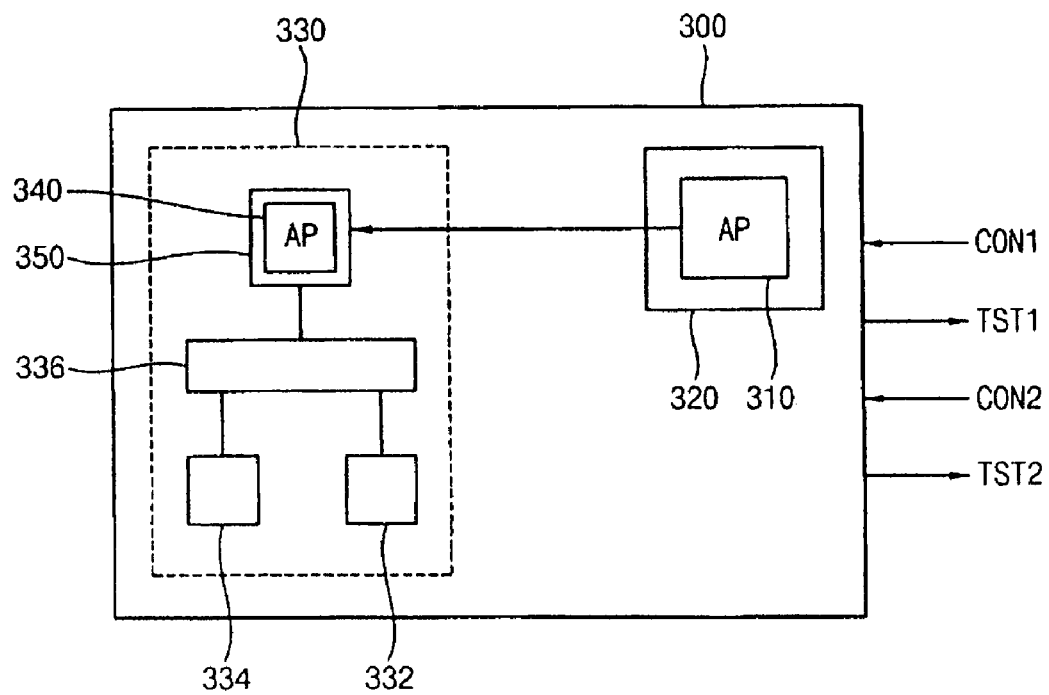
FIG. 5 is a block diagram illustrating a test board according to another example embodiment of the present invention.

FIG. 5 is a block diagram illustrating a test board according to another example embodiment of the invention.

Referring to FIG. 5, a test board 300 includes a first socket 320 and mounting test circuit 330. The first socket 320 and the mounting test circuit 330 are physically disconnected. The mounting test circuit 330 includes a second socket 350, a first memory 332, a second memory 334 and a buffer 336. The mounting test circuit 330 has a same configuration as an environment where an analog core embedded application processor 310 is actually used. The analog core embedded application processor 310 may be installed into the first and second sockets 320 and 350. The first memory 332 and the second memory 334 are electrically coupled to the buffer 336, and the buffer 336 is connected to the second socket 350. The first memory 332 may include a booting program for booting the analog core embedded application processor 340 and a test program for a mounting set test on the analog core embedded application processor 340. The first memory 332 may be a non-volatile memory such as a flash memory. The second memory 334 may be a volatile memory such as a DRAM.

The test board receives a first control signal CON1 that is provided externally, for example from an automatic test equipment (ATE). The first control signal CON1 may be a start signal of a vector test on the analog core embedded application processor 310. A test program for the vector test may be stored in the ATE (not illustrated). A vector test result TST1 on the analog core embedded application processor 310 is provided to the external ATE. Whether a mounting set test on the analog core embedded application processor 310 is performed or not is determined based on the vector test result TST1.

When the vector test result TST1 indicates "fail", that is, when the analog core embedded application processor 310 does not pass the vector test, an external handler (not illustrated) uninstalls the analog core embedded application processor 310 from the first socket 320, and a new analog core embedded application processor to be subsequently tested is installed into the first socket 320. The mounting set test is not performed on the analog core embedded application processor that did not pass the vector test.

When the vector test result TST1 indicates "pass", that is, when the analog core embedded application processor 310 passes the vector test, a second control signal CON2 is enabled. The second control signal CON2 may be provided to the test board 300 from the external ATE. When the second control signal CON2 is enabled, the analog core embedded application processor 310 is transferred from the first socket 320 to the second socket 350 by an external handler (not illustrated). The mounting set test is performed on the analog core embedded application processor 340 installed in the second socket 350. That is, when the second control signal CON2 is enabled and the analog core embedded application processor 340 is installed into the second socket 350, the booting program and the test program stored in the first memory 332 are loaded onto the second memory 334 through the buffer 336. The analog core embedded application processor 340 is booted by the loaded booting program, and the mounting set test is performed on the analog core embedded application processor 340 installed in the second socket 350 by the loaded test program.

When the mounting set test on the analog core embedded application processor 340 is completed, a mounting set test result TST2 is provided to the external ATE. Therefore, the vector test result TST1 and the mounting set test result TST2 are identified. The analog core embedded application processors 310 and 340 may be the same as or different from each other. While the mounting set test is performed on the analog core embedded application processor in the second socket 350, the vector test may be performed on another analog core embedded application processor in the first socket 320. That is, a vector test and a mounting set test are simultaneously performed on different analog core embedded application processors in first and second sockets 320 and 350.

Figure 6:
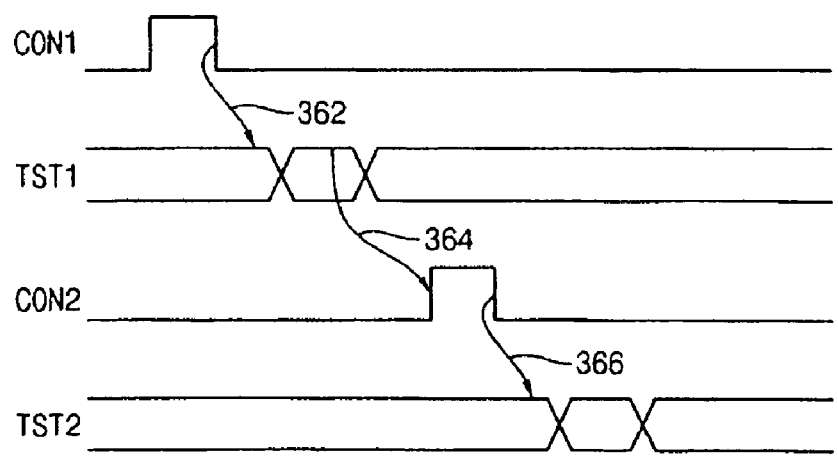
FIG. 6 is a timing diagram illustrating signals indicating operation of the test board of FIG. 5.

FIG. 6 is a timing diagram illustrating signals indicating operation of the test board of FIG. 5.

Referring to FIGS. 5 and 6, when the first control signal CON1 is enabled, the vector test is performed 362 on the analog core embedded application processor 310 and the vector test result TST1 is provided. When the vector test result TST1 corresponds to "pass" 364, the second control signal CON2 is enabled, the analog core embedded application processor 310 is installed into the second socket 350, the mounting set test is performed 366, and the mounting set test result TST2 is provided. In an example embodiment of FIG. 6, the first and second control signals CON1 and CON2, the vector test result TST1 and the mounting set test result TST2 are enabled at logic high levels. In another example embodiment, the first and second control signals CON1 and CON2, the vector test result TST1 and the mounting set test result TST2 may be enabled at logic low levels.

Figure 7:
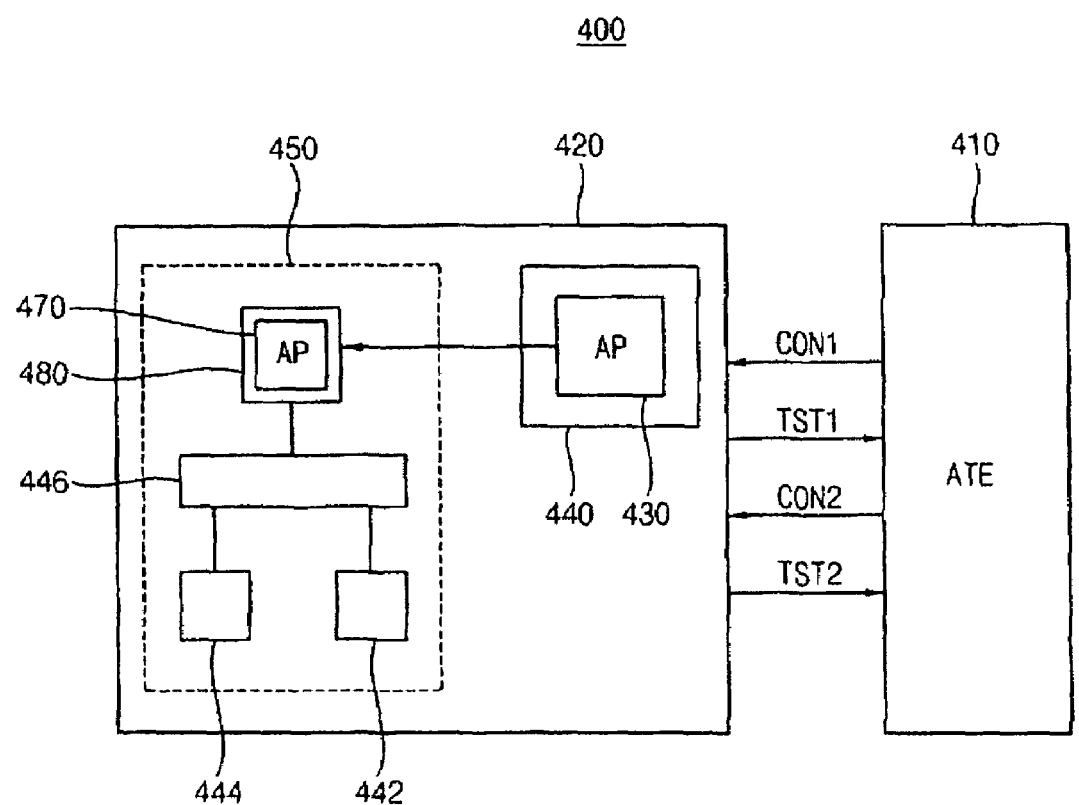
FIG. 7 is a block diagram illustrating a test system according to another example embodiment of the present invention.

FIG. 7 is a block diagram illustrating a test system according to another example embodiment of the present invention.

Referring to FIG. 7, a test system 400 includes a test board 420 and an automatic test equipment (ATE) 410.

The ATE 410 stores a first test program for a vector test of an analog core embedded application processor 430, and provides a first control signal CON1, and a second control signal CON2 to the test board 420.

The test board 420 includes a first socket 440 and mounting test circuit 450. The mounting test circuit 450 includes a second socket 480, a first memory 442, a second memory 444 and a buffer 446. The mounting test circuit 450 has a same configuration as an environment where analog core embedded application processors 430 and 470 are actually used. The first memory 442 and the second memory 444 are electrically coupled to the buffer 446, and the buffer 446 is connected to the second socket 480. The first memory 442 may include a booting program for booting the analog core embedded application processor 470 and a second test program for mounting set testing the analog core embedded application processor 470. The first memory 442 may be a non-volatile memory such as a flash memory. The second memory 444 may be a volatile memory such as a DRAM.

When the first control signal CON1 is enabled, the vector test is performed on the analog core embedded application processor 430 and a vector test result TST1 on the analog core embedded application processor 430 is provided to the ATE 410. When the vector test result TST1 indicates "pass", the second control signal CON2 is enabled. When the second control signal CON2 is enabled, the analog core embedded application processor 430 is transferred from the first socket 440 to the second socket 480 by an external handler (not illustrated). The mounting set test is performed on the analog core embedded application processor 480. When the mounting set test on the analog core embedded application processor 470 is completed, a mounting set test result TST2 is provided to the ATE 410. Therefore, the vector test result TST1 and the mounting set test result TST2 are identified.

When the vector test result TST1 indicates "fail", an external handler (not illustrated) uninstalls the analog core embedded application processor 430 from the first socket 440. The mounting set test is not performed on the analog core embedded application processor that did not pass the vector test, and a new analog core embedded application processor to be subsequently tested is installed into the socket 440.

While the mounting set test is performed on the analog core embedded application processor 470 in the second socket 480, the vector test may be performed on another analog core embedded application processor in the first socket 440. That is, a vector test and a mounting set test are simultaneously performed on different analog core embedded application processors in first and second sockets 440 and 480. Operating of the test system 400 of FIG. 7 is similar to operation of the test board 300 of FIG. 5, and thus further description of the test system 400 will not be repeated.

Hereinafter, a testing method according to an example embodiment will be described with reference to FIGS. 1 to 3.

In a testing method according to an example embodiment, an analog core embedded application processor 120 is tested by using a test board 100 including a socket 130 into which the analog core embedded application processor 120 is installed, a mounting test circuit 140 that has a same configuration as an environment where the analog core embedded application processor is actually used, and a relay 150 that connects the mounting test circuit 140 to the socket 130.

A vector test is performed on the analog core embedded application processor 120 in response to a first control signal CON1. When the first control signal CON1 is enabled, the socket 130 is physically disconnected from the mounting test circuit 140, and the vector test is performed on the analog core embedded application processor 120. When a vector test result corresponds to "pass", the second control signal CON2 is enabled, the mounting test circuit 140 is connected to the socket 130, and a mounting set test is performed on the analog core embedded application processor 120.

According to example embodiments, a vector test and a mounting set test may be performed on an analog core embedded application processor using one test board, and the mounting set test is performed on the analog core embedded application processor that passed the vector test, and thus test time may be reduced. In addition, the vector test and the mounting set test are simultaneously performed on different analog core embedded application processors respectively, and thus test time and test cost may be reduced.

The foregoing is illustrative of the present invention and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A test board comprising:
    a socket into which an analog core embedded application processor is installed;
    a mounting test circuit that has a same configuration as an environment where the analog core embedded application processor is actually used; and
    a relay that disconnects the mounting test circuit from the socket in response to a first control signal when a vector test is performed on the analog core embedded application processor, and that connects the mounting test circuit to the socket in response to a second control signal when a mounting set test is performed on the analog core embedded application processor,
    wherein the vector test is performed on the analog core embedded application processor when the first signal is enabled, and a first test result is provided to an automatic test equipment (ATE), the first test result indicating a result of the vector test, and
    wherein the mounting test circuit comprises:
        a first memory that stores a booting program for booting the analog core embedded application processor and a test program for the mounting set test on the analog core embedded application processor;
        a second memory into which the booting program and the test program are loaded; and
        a buffer coupled to the first memory, the second memory and the relay.

2. The test board of claim 1, wherein the mounting set test is performed on the analog core embedded application processor according to the first test result.

3. The test board of claim 2, wherein when the first test result corresponds to "pass", the second control signal is enabled, the mounting test circuit is connected to the socket, the mounting set test is performed on the analog core embedded application processor, and a second test result is provided to the ATE, the second test result indicating a result of the mounting set test.

4. The test board of claim 1, wherein the first memory corresponds to a non-volatile memory.

5. The test board of claim 1, wherein the second memory corresponds to a volatile memory.

6. A test system comprising:
    an automatic test equipment (ATE) that stores a program for a vector test, and provides a first control signal and a second control signal; and
    a test board that receives the first control signal and the second control signal from the ATE, the test board including:
        a socket into which an analog core embedded application processor is installed;
        a mounting test circuit that has a same configuration as an environment where the analog core embedded application processor is actually used; and
    a relay that disconnects the mounting test circuit from the socket in response to the first control signal when the vector test is performed on the analog core embedded application processor, and that connects the mounting test circuit to the socket in response to the second control signal when a mounting set test is performed on the analog core embedded application processor.

7. The test board of claim 6, wherein the vector test is performed on the analog core embedded application processor when the first signal is enabled, and a first test result is provided to the ATE, the first test result indicating a result of the vector test.

8. The test board of claim 7, wherein the mounting set test is performed on the analog core embedded application processor according to the first test result.

9. The test board of claim 8, wherein when the first test result corresponds to "pass", the second control signal is enabled, the mounting test circuit is connected to the socket, the mounting set test is performed on the analog core embedded application processor, and a second test result is provided to the ATE, the second test result indicating a result of the mounting set test.

10. The test board of claim 6, wherein mounting test circuit comprises:
   a first memory that stores a booting program for booting the analog core embedded application processor and a test program for the mounting set test on the analog core embedded application processor;
   a second memory into which the booting program and the test program are loaded; and
   a buffer coupled to the first memory, the second memory and the relay.

11. The test board of claim 10, wherein the first memory corresponds to a non-volatile memory.

12. The test board of claim 10, wherein the second memory corresponds to a volatile memory.

* * * * *